(12) United States Patent
Takahashi et al.

(10) Patent No.: US 10,882,757 B2
(45) Date of Patent: Jan. 5, 2021

(54) ANHYDROUS NICKEL CHLORIDE AND METHOD FOR PRODUCING THE SAME

(71) Applicant: JX Nippon Mining & Metals Corporation, Tokyo (JP)

(72) Inventors: Hideyuki Takahashi, Kitaibaraki (JP); Kouichi Takemoto, Kitaibaraki (JP)

(73) Assignee: JX Nippon Mining & Metals Corporation, Toyko (JP)

( * ) Notice: Subject to any disclaimer, the term of this patent is extended or adjusted under 35 U.S.C. 154(b) by 311 days.

(21) Appl. No.: 15/753,126

(22) PCT Filed: Jan. 13, 2017

(86) PCT No.: PCT/JP2017/001085
§ 371 (c)(1),
(2) Date: Feb. 15, 2018

(87) PCT Pub. No.: WO2017/126442
PCT Pub. Date: Jul. 27, 2017

(65) Prior Publication Data
US 2018/0237313 A1    Aug. 23, 2018

(30) Foreign Application Priority Data
Jan. 21, 2016 (JP) .................. 2016-010031

(51) Int. Cl.
*C01G 53/09*    (2006.01)
*C25B 1/26*    (2006.01)
(Continued)

(52) U.S. Cl.
CPC ........ *C01G 53/09* (2013.01); *C23C 16/45553* (2013.01); *C25B 1/26* (2013.01);
(Continued)

(58) Field of Classification Search
CPC ... C01G 53/09; C23C 16/45553; C23C 16/14; C25B 1/26; H01L 21/285; C01P 2006/80;
(Continued)

(56) References Cited

FOREIGN PATENT DOCUMENTS

| CN | 105220184 A | 1/2016 |
|---|---|---|
| EP | 1604954 A1 | 12/2005 |

(Continued)

OTHER PUBLICATIONS

English Translation of the International Preliminary Report on Patentability for PCT/JP2017/001085, dated Aug. 7, 2018, 9 pages.

(Continued)

*Primary Examiner* — Arun S Phasge
(74) *Attorney, Agent, or Firm* — Faegre Drinker Biddle and Reath LLP; Robert E. Cannuscio

(57) ABSTRACT

Provided is anhydrous nickel chloride having a total content of impurity elements other than gas components of less than 10 wt. ppm; each content of boron, sodium, magnesium, aluminum, potassium, calcium, titanium, chromium, manganese, iron, copper, zinc, arsenic, silver, cadmium, indium, tin, thallium and lead of less than 1 wt. ppm, which can be produced by a method for producing anhydrous nickel chloride comprising the steps of carrying out ion exchange membrane electrolysis in an anolyte and a catholyte separated by an anion exchange membrane using raw metal nickel as an anode, a conductive material as a cathode and high purity hydrochloric acid as an electrolytic solution, to obtain a nickel chloride solution as the anolyte; concentrating the obtained nickel chloride solution by heating it at 80

(Continued)

to 100° C. under atmospheric pressure to obtain a concentrated nickel chloride solution; and dehydrating and drying the resulting concentrated nickel chloride solution by heating it at 180 to 220° C. under atmospheric pressure to obtain anhydrous nickel chloride.

13 Claims, 2 Drawing Sheets

(51) Int. Cl.
*H01L 21/285* (2006.01)
*C23C 16/455* (2006.01)
*C23C 16/14* (2006.01)

(52) U.S. Cl.
CPC ........ *H01L 21/285* (2013.01); *C01P 2004/51* (2013.01); *C01P 2004/60* (2013.01); *C01P 2004/61* (2013.01); *C01P 2006/11* (2013.01); *C01P 2006/80* (2013.01); *C23C 16/14* (2013.01)

(58) Field of Classification Search
CPC .............. C01P 2004/61; C01P 2004/51; C01P 2004/60; C01P 2006/11
See application file for complete search history.

(56) References Cited

FOREIGN PATENT DOCUMENTS

| | | | |
|---|---|---|---|
| JP | 632618 | A | 2/1994 |
| JP | H11228145 | A | 8/1999 |
| JP | 11263625 | A | 9/1999 |
| JP | 2000219988 | A | 8/2000 |
| JP | 2002-274854 | * | 9/2002 |
| JP | 2002348122 | A | 12/2002 |
| JP | 2007290937 | A | 11/2007 |
| JP | 4127477 | B2 | 7/2008 |
| JP | 2010248043 | A | 11/2010 |
| JP | 4918194 | B2 | 4/2012 |
| WO | 9502073 | A2 | 1/1995 |

OTHER PUBLICATIONS

Extended European Search Report for Application No. 17741320.0 dated Jul. 22, 2019, 8 pages.
International Search Report for PCT/JP2017/001085, dated Mar. 14, 2017, 4 pages.

* cited by examiner

[FIG. 1]
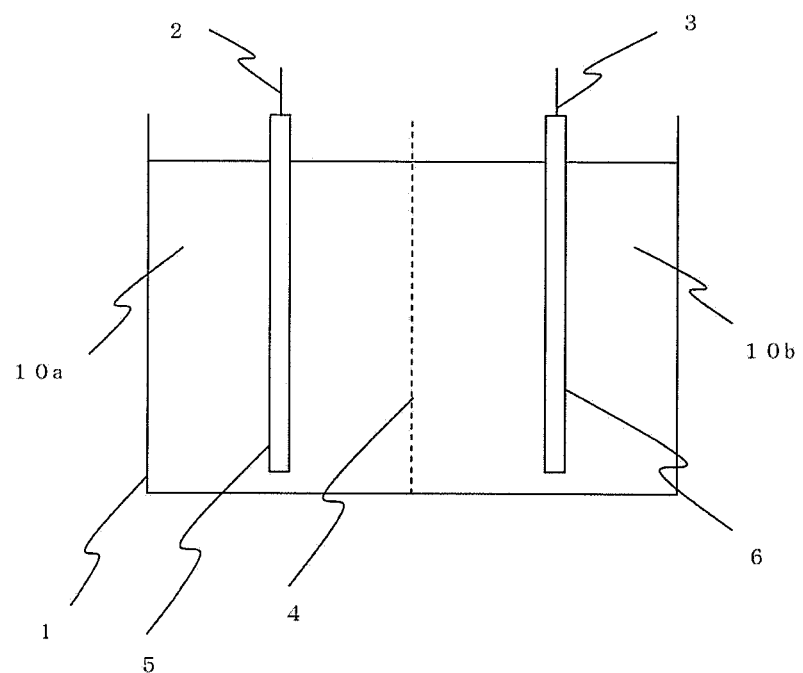

[FIG. 2]
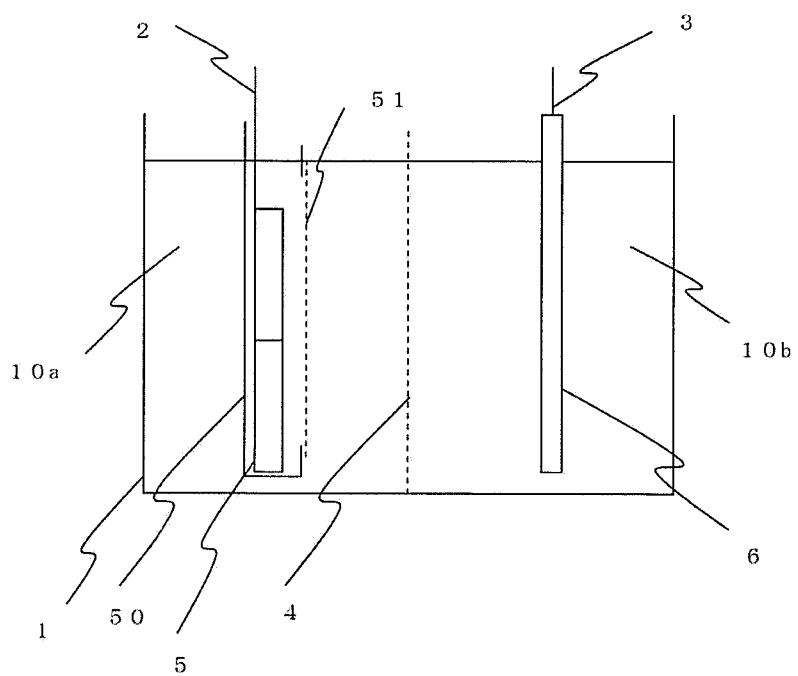

ANHYDROUS NICKEL CHLORIDE AND METHOD FOR PRODUCING THE SAME

TECHNICAL FIELD

The present invention relates to anhydrous nickel chloride which is suitable for precursor materials of metal organic chemical vapor deposition (hereinafter, abbreviated as MO-CVD: Metal Organic Chemical Vapor Deposition) and atomic layer deposition (hereinafter, abbreviated as ALD: Atomic Layer Deposition), and to a method for producing the same.

BACKGROUND ART

A Nickel thin film for use in the production of a next generation ultra-large density semiconductor device (ULSI) is formed by MO-CVD or ALD, and for its source gas an organometallic complex is used as a precursor. Anhydrous nickel chloride that is a raw material for the precursor is required to have high purity, and several production methods have been proposed (Patent Document 1, Patent Document 2, and Patent Document 3). Patent Document 1 discloses a method for producing anhydrous nickel chloride by drying nickel chloride at 240 to 250° C. in a first stage and then at 300 to 340° C. in a second stage to produce anhydrous nickel chloride with a moisture content of 0.2 to 0.3 wt. %. Patent Document 2 discloses a method for producing anhydrous nickel chloride by dissolving metallic nickel in hydrochloric acid, removing impurities, dehydrating/drying the nickel chloride solution, and granulating the product. Further, it discloses that particles having a particle diameter of 4 mm or more are 1% by mass or less, particles having a particle diameter of 0.3 mm or less are 60% by mass or less, bulk density is 1.5 to 0.9 kg/L and in Examples, anhydrous nickel chloride contains 0.1 wt. % of water and 10 to 40 wt.ppm of iron. Patent Document 3 discloses a method for producing anhydrous chloride nickel having a NiO content of 0.1 to 1% by mass by heat-treating nickel chloride hexahydrate at 160 to 200° C. in the atmospheric pressure or 100 torr.

CITATION LIST

[Patent Document 1] Japanese Patent No. 4918194 B1
[Patent Document 2] Japanese Patent No. 4127477 B1
[Patent Document 3] Japanese Patent Application Public Disclosure (KOKAI) No. H 11-263625 A1

SUMMARY OF THE INVENTION

Problem to be Solved by the Invention

In the conventional production method, the produced anhydrous nickel chloride contained about 50 wt. ppm of remaining iron and 1 wt. % of components other than anhydrous nickel chloride. According to findings of the present inventors, when anhydrous nickel chloride containing such impurity components is used for manufacturing a device on a semiconductor wafer as a raw material of a precursor for MO-CVD or ALD, the resulting nickel film has a problem of bringing about increased film resistance and unstable gate voltage. Furthermore, when using anhydrous nickel chloride containing such impurity components, there is a problem that the yield is decreased when synthesizing the precursor of CVD raw material.

Accordingly, an object of the present invention is to provide anhydrous nickel chloride having higher purity and lower content of impurity components than the prior art, and a method for producing the same.

Means for Solving the Problem

As a result of intensive studies, the present inventors have found that high purity anhydrous nickel chloride can be obtained by preparing an aqueous solution of nickel chloride from metallic nickel raw material using an ion exchange membrane electrolytic method, optionally removing iron ions that are main impurities, and then creating environments that will reduce foreign impurities in concentration and dehydration steps, and have completed the present invention.

Therefore, the present invention includes the following aspects (1) to (4):

(1)
Anhydrous nickel chloride having a total content of impurity elements other than gas components of less than 10 wt. ppm; each content of boron, sodium, magnesium, aluminum, potassium, calcium, titanium, chromium, manganese, iron, copper, zinc, arsenic, silver, cadmium, indium, tin, thallium and lead of less than 1 wt. ppm; and each content of silicon and cobalt of less than 5 wt. ppm.

(2)
Anhydrous nickel chloride having an oxygen content of less than 350 wt. ppm (or a water content of less than 0.5 wt. %).

(3)
The anhydrous nickel chloride according to the aspect (1) or (2), wherein the total of particles having a particle size of 4 mm or more is 10 wt. % or more, and preferably 50 wt. % or more, and particles having a particle size of 0.3 mm or less are 30 wt. % or less, and preferably 10 wt. % or less.

(4)
The anhydrous nickel chloride according to any one of the aspects (1) to (3), wherein the anhydride nickel chloride has a bulk density of 1.5 to 3.0 g/cm$^3$ and a tapped density of 2.0 to 3.3 g/cm$^3$.

Furthermore, the present invention includes the following aspects (11) to (21):

(11)
A method for producing nickel chloride anhydride, comprising the steps of:

carrying out ion exchange membrane electrolysis in an anolyte and a catholyte separated by an anion exchange membrane using raw metal nickel as an anode, a conductive material as a cathode and high purity hydrochloric acid as an electrolytic solution, to obtain a nickel chloride solution as the anolyte;

concentrating the obtained nickel chloride solution by heating it at 80 to 100° C. under atmospheric pressure to obtain a concentrated nickel chloride solution; and dehydrating and drying the resulting concentrated nickel chloride solution by heating it at 180 to 220° C. under atmospheric pressure to obtain anhydrous nickel chloride.

(12)
The method according to the aspect (11), wherein after the step of obtaining the nickel chloride solution as the anolyte, the method comprises any one of the following steps (a) to (c):

(a) contacting the nickel chloride solution with a solvent extracting agent and then separating them to obtain an iron-removed nickel chloride solution;

(b) contacting the nickel chloride solution with an ion exchange resin and then separating them to obtain an iron-removed nickel chloride solution; and (c) adding hydrogen peroxide water to the nickel chloride solution or blowing oxygen-containing gas to provide an oxidation-reduction potential of 700 mV or more so that an iron ion is oxidized to trivalent one, and depositing and precipitating the iron ion and then separating it to obtain an iron-removed nickel chloride solution, and wherein after any one of the steps (a) to (c), the method further comprises conducting the following step, using the iron-removed nickel chloride solution as a nickel chloride solution:

concentrating the resulting nickel chloride solution by heating it at 80 to 100° C. under atmospheric pressure to obtain a concentrated nickel chloride solution.

(13)

The method according to the aspect (11) or (12), wherein in the step of obtaining the concentrated nickel chloride solution, the obtained nickel chloride solution is heated and concentrated in a quartz container.

(14)

The method according to any one of the aspects (11) to (13), wherein in the step of obtaining the concentrated nickel chloride solution, the heating is performed in the atmosphere.

(15)

The method according to any one of the aspects (11) to (14), wherein in the step of obtaining anhydrous nickel chloride, the resulting concentrated nickel chloride solution is dried and dehydrated on a quartz container.

(16)

The method according to any one of the aspects (11) to (15), wherein in the step of obtaining anhydrous nickel chloride, the drying is performed in an inert gas atmosphere.

(17)

The method according to the aspects (11) to (16), wherein the step of obtaining anhydrous nickel chloride is to dry and dehydrate the resulting concentrated nickel chloride solution by heating it at 180 to 220° C. under atmospheric pressure and crush the resulting product to obtain anhydrous nickel chloride powder.

(18)

The method for producing anhydrous nickel chloride according to any one of the aspects (11) to (17), wherein the total content of impurity elements other than gas components is less than 10 wt. ppm, each content of boron, sodium, magnesium, aluminum, potassium, calcium, titanium, chromium, manganese, iron, copper, zinc, arsenic, silver, cadmium, indium, tin, thallium and lead is less than 1 wt. ppm and each content of silicon and cobalt is less than 5 wt. ppm.

(19)

The method for producing anhydrous nickel chloride according to any one of the aspects (11) to (18), wherein the oxygen content is less than 350 wt. ppm (or the water content is less than 0.5 wt. %).

(20)

The method for producing anhydrous nickel chloride according to any one of the aspects (11) to (19), wherein the anhydrous nickel chloride is such that the total of particles having 4 mm or more is 10 wt. % or more, and preferably 50 wt. % or more, and particles having 3 mm or less is 30 wt. % or less, and preferably 10 wt. %.

(21)

The method for producing anhydrous nickel chloride, according to any one of the aspects (11) to (20), wherein the anhydrous nickel chloride has a bulk density of 1.5 to 3.0 $g/cm^3$ and a tapped density of 2.0 to 3.3 $g/cm^3$.

Effects of the Invention

According to the present invention, it is possible to obtain anhydrous nickel chloride having higher purity and lower impurity content than the prior art. When the high purity anhydrous nickel chloride is used in the production of a device on a semiconductor wafer, a stable gate voltage can be realized because the anhydrous nickel chloride has a small amount of transition metal impurity that will affect work function. Further, since it has high purity, an increase in resistance due to impurities can be reduced even in the formation of nickel silicide. Further, since it has high purity, a yield can be increased when synthesizing the precursor of the CVD raw material. Furthermore, the production method of the present invention does not include dissolution with a high concentration strong acid, so that the method has a smaller environmental load than the prior art and the anhydrous nickel chloride can be produced in simple facilities.

BRIEF DESCRIPTION OF THE DRAWINGS

FIG. 1 is an explanatory view showing arrangement of an electrolytic bath used for electrolytic synthesis.

FIG. 2 is an explanatory view showing arrangement of an electrolytic bath provided with an anode basket used for electrolytic synthesis.

MODES FOR CARRYING OUT THE INVENTION

Hereinafter, the present invention will be described in detail by way of embodiments. The present invention is not limited to specific embodiments as mentioned below.

[Production of Anhydrous Nickel Chloride]

The anhydrous nickel chloride of the present invention can be produced by a method comprising the steps of carrying out ion exchange membrane electrolysis in an anolyte and a catholyte separated by an anion exchange membrane using raw metal nickel as an anode, a conductive material as a cathode and high purity hydrochloric acid as an electrolytic solution, to obtain a nickel chloride solution as the anolyte; concentrating the obtained nickel chloride solution by heating it at 80 to 100° C. under atmospheric pressure to obtain a concentrated nickel chloride solution; and dehydrating and drying the resulting concentrated nickel chloride solution by heating it at 180 to 220° C. under atmospheric pressure to obtain anhydrous nickel chloride. In addition, when the purified nickel chloride solution is subjected to the above heating and concentrating treatment, the treatment at a temperature lower than 80° C. is not desirable because it takes a very long time to concentrate the solution, and the treatment at a temperature higher than 100° C. is not desirable because the solution boils. Further, when the concentrated nickel chloride solution is subjected to the drying and dehydrating treatment, the treatment at a temperature lower of than 180° C. is not desirable because it takes a very long time to dry the solution, and the treatment at a temperature of higher than 220° C. is not desirable because it results in restrictions on and severe handling of the heating apparatus.

[Iron Removal Step]

In the above production method, the iron ions serving as impurities may be contaminated in the resulting nickel chloride solution. In a preferred embodiment, a step of removing the iron ions can be performed. The step of removing the iron ions can be carried out after the above step of obtaining the nickel chloride solution as the anolyte, and the resulting iron-removed and purified nickel chloride solution can be used as a material for the above step of concentrating the nickel chloride solution by heating it at 80 to 100° C. under atmospheric pressure to obtain a concentrated nickel chloride solution. As the iron removal step, "solvent extraction", "ion exchange" or "iron oxidation" step as mentioned below can be used.

[Solvent Extraction]

In a preferred embodiment, a solvent extraction step can be performed as the iron removal step. In the solvent extraction step, a solvent extracting agent is brought into contact with the nickel chloride solution to extract and remove iron ions. The solvent extracting agent may include, for example, 2-ethylhexyl hydrogen-2-ethylhexylphosphonate, bis(2-ethylhexyl)hydrogen phosphate and bis(2-ethylhexyl)phosphinic acid, and 2-ethylhexyl hydrogen-2-ethylhexylphosphonate is preferable. The solvent extracting agent can be separated and removed from the nickel chloride solution, and the removal can be completed by known means such as activated carbon, if necessary.

[Ion Exchange]

In a preferred embodiment, an ion exchange step can be performed as the iron removal step. In the ion exchange step, the iron ions are ion-exchanged and removed by contacting the iron ions with an ion exchange resin. The ion exchange resin may include, for example, strongly basic anion exchange resins and chelate resins, and the strongly basic anion exchange resins are preferable.

[Iron Oxidation]

In a preferred embodiment, an iron oxidation step can be performed as the iron removal step. In the iron oxidation process, the iron ion is oxidized to change the iron ion to trivalent one and deposited and precipitated in the nickel chloride solution, and the precipitate is separated by filtration. The oxidation of iron ion can be carried out by adding hydrogen peroxide water to the nickel chloride solution or by blowing an oxygen-containing gas in the nickel chloride solution to have an oxidation-reduction potential of 700 mV or more.

[Raw Material Metallic Nickel]

Raw material metallic nickel can be used without any limitation as long as it has a purity of 4N (99.99%) or more, but it is more preferable to use raw material metallic nickel having further higher purity, for example, 5N (99.999%) or 6N (99.9999%), because the step of removing iron that is the main impurity can be omitted.

The raw metal metallic nickel preferably has a flat and smooth shape in order to stabilize the electrolytic state when performing electrolysis. The metallic nickel having 4N (99.99%) as used herein refers to metallic nickel having purity in which the total content of detected impurities, excluding gas components such as hydrogen, carbon, nitrogen and oxygen, is less than 0.01%.

[Anode]

There is a method of directly using nickel as an anode or a method of energizing nickel via an insoluble electrode, for electrolysis of nickel. Non-limiting examples of the insoluble electrode that can be used include commonly known insoluble electrodes, such as, preferably, platinum or platinum-plated titanium, or platinum group metal-coated and calcined titanium.

[Cathode]

Non-limiting examples of the cathode that can be used include cathodes having conductivity, such as, preferably, titanium, nickel or graphite.

[Electrolytic Solution]

Non-limiting examples of the electrolytic solution that can be used include electrolytic solutions having high purity, such as hydrochloric acid with purity of the special grade or for electronic industry, which can be diluted with pure water to form dilute hydrochloric acid having a concentration of 0.1 to 6.0 N, when using it.

[Anion Exchange Membrane]

As the anion exchange membrane, known anion exchange membranes can be used.

[Nickel Chloride Solution]

The nickel chloride solution obtained as an anolyte has already high purity except for gas components. Accordingly, the present invention also relates to a high purity nickel chloride solution and a method for producing the same.

[Heating and Concentrating]

The nickel chloride solution is heated and concentrated to obtain a concentrated nickel chloride solution. The heating and concentrating treatment is carried out by heating the solution at 80 to 100° C., and preferably 90 to 100° C. under atmospheric pressure. In a preferred embodiment, the heating and concentrating treatment is carried out in the atmosphere. In a preferred embodiment, a nickel chloride solution (a solution of nickel chloride in dilute hydrochloric acid) is heated and concentrated in a quartz container.

[Heating, Drying and Dehydrating]

The concentrated nickel chloride solution is heated, dehydrated and dried to obtain anhydrous nickel chloride. The Heating, dehydrating and drying treatment is carried out by heating the solution at 180 to 220° C., and preferably 190 to 210° C., under atmospheric pressure. In a preferred embodiment, the heating and drying are carried out in an inert gas. In a preferred embodiment, the concentrated nickel chloride solution is heated and dried on a quartz container.

[Crushing]

In a preferred embodiment, the concentrated nickel chloride solution can be dried by heating it, and crushing the dried product to obtain anhydrous nickel chloride powder. In a preferred embodiment, the crushing can be carried out on a quartz container.

[Anhydrous Nickel Chloride]

The resulting anhydrous nickel chloride has the total content of impurity elements other than gas components of less than 10 wt. ppm, and each content of boron, sodium, magnesium, aluminum, potassium, calcium, titanium, chromium, manganese, iron, copper, zinc, arsenic, silver, cadmium, indium, tin, thallium and lead of less than 1 wt. ppm, and each content of silicon and cobalt of less than 5 wt. ppm.

The gas component elements as used herein refer to oxygen, nitrogen, hydrogen, and carbon. The contents of impurity elements other than the gas component elements refer to values measured by glow discharge mass spectrometry (hereinafter, abbreviated as GD-MS: Glow Discharge Mass Spectrometry).

[Anhydrous Nickel Chloride Powder]

In a preferred embodiment, anhydrous nickel chloride is obtained as powder. In a preferred embodiment, the anhydrous nickel chloride powder is such that the total of particles having a particle size of 4 mm or more is, for example, 10% by mass or more, and preferably 50% by mass or more, and particles having a particle size of 0.3 mm or less is 30% by mass or less, and preferably 10% by mass or less. These particle sizes and contents can be measured by sieving.

[CVD Raw Material]

The anhydrous nickel chloride having high purity according to the present invention is used as a good raw material for CVD (chemical vapor deposition). Accordingly, the present invention also relates to a raw material for CVD using high purity anhydrous nickel chloride, a nickel film or nickel fine powder formed by the CVD raw material, and a semiconductor device, an electronic circuit, an electronic device or like formed by the nickel film or nickel fine powder, as well as to methods for producing these.

EXAMPLE

Hereinafter, the present invention will be described in more detail with reference to Examples. The present invention is not limited to the following Examples.

Example 1

An electrolytic bath equipped with an ion exchange membrane (hydrocarbon-based anion exchange membrane) was prepared, and 8 L of high purity hydrochloric acid diluted with pure water to 1N concentration was placed in an anolyte, and 8 L of hydrochloric acid having 6N concentration was similarly placed in a catholyte. 2,409 g of nickel having purity of 5N, equipped with a conducting wire, was prepared as an anode, and a titanium plate was prepared as a cathode. A direct-current power source was connected between the anode and the cathode, and the current was applied at a current value of 5 A constant current for 120 hours. During the current application, the voltage varied between 1.4 and 2.8 V. The liquid temperature was increased from 30° C. at the beginning to maximum 35° C. After the electrolysis, measurement of the weight of nickel demonstrated that the weight was reduced to 1,736 g, and the dissolved weight was 673 g. A nickel chloride solution was thus obtained by electrolytic synthesis.

Analysis of the concentration of the solution demonstrated that the nickel concentration was 84 g/L and the iron concentration was 0.1 mg/L or less.

Next, 1.5 L of the solution was placed in a quartz container and heated to 100° C. on a hot plate to evaporate moisture. Once moisture was removed (that is, the solution was in the form of sherbet), the temperature was further raised to 180° C. in the atmosphere and held for 2 hours. 270 g of produced crystal was recovered.

This was crushed using a quartz container in a nitrogen atmosphere and sieved to obtain nickel chloride powder.

Analysis of the crystal structure of the nickel chloride powder by X-ray diffraction revealed that anhydrous nickel chloride was formed.

The impurity content of the anhydrous nickel chloride crystal was determined by GD-MS analysis, and results are shown in Table 1. Table 1 also shows results of measurement of particle size using a sieve, bulk density and tapped density.

Comparative Example 1

1.5 L of the nickel chloride solution obtained at the end of the electrolysis step in Example 1 was placed in a quartz container and heated to 90° C. on a hot plate to evaporate moisture. Once moisture was removed, the temperature was further raised to 160° C. in the atmosphere and held for 2 hours. The resulting crystal was recovered and 285 g was obtained.

This was crushed using a quartz container in a nitrogen atmosphere and sieved to obtain nickel chloride powder.

Analysis of the crystal structure of the nickel chloride powder by X-ray diffraction demonstrated that nickel chloride hexahydrate was formed in addition to hydrous nickel chloride.

The impurity content of the anhydrous nickel chloride crystal was determined by GD-MS analysis, and results are shown in Table 1. Table 1 also shows results of measurement of particle size using a sieve, bulk density and tapped density.

Example 2

The same electrolytic bath as in Example 1 was prepared, and two kind of hydrochloric acid as in Example 1 were placed in the anolyte and the catholyte, respectively. 2,520 g of commercially available nickel with a purity of 4N equipped with a conducting wire was prepared as the anode and a titanium plate was prepared as the cathode. A direct-current power source was connected between the anode and the cathode, and the current was applied at a current value of 5 A constant current for 120 hours. During the current application, the voltage varied between 1.5 and 3.2 V. The liquid temperature was increased from 28° C. at the beginning to maximum 36° C. After the electrolysis, measurement of the weight of nickel demonstrated that the weight was reduced to 1,840 g, and the dissolved weight was 680 g. A nickel chloride solution was then obtained by electrolytic synthesis.

Analysis of the concentration of the solution showed that the nickel concentration was 86 g/L and the iron concentration was 0.6 mg/L.

To 1.5 L of the nickel chloride solution obtained at the end of the electrolysis step was added a solvent extracting agent mixture comprising 1.0 L of the solution, 830 mL of normal paraffin and 170 mL of a solvent extracting agent (2-ethylhexyl hydrogen-2-ethylhexylphosphonate), and placed in the same container, stirred for 30 minutes, and then left to stand for 1 hour. The solvent extracting agent separated in an upper layer was isolated to recover a nickel chloride solution in a lower layer. Then, 20 g of activated carbon was added to the nickel chloride solution, stirred for 1 hour, and then filtered to remove the solvent extracting agent remaining in the nickel chloride solution. The solvent extracting treatment was thus performed to obtain a purified nickel chloride solution.

The nickel chloride solution was then placed in a quartz container and heated to 90° C. on a hot plate to evaporate moisture. Once moisture was removed, the temperature was further raised to 200° C. in the atmosphere and held for 2 hours. 278 g of produced crystal was recovered.

This was crushed using a quartz container in a nitrogen atmosphere and sieved to obtain nickel chloride powder.

Analysis of the crystal structure of the nickel chloride powder by X-ray diffraction revealed that anhydrous nickel chloride was formed.

The impurity content in the anhydrous nickel chloride crystal was determined by GD-MS analysis, and results are shown in Table 1. Table 1 also shows results of measurement of particle size using a sieve, bulk density and tapped density.

Example 3

High purity hydrochloric acid was added to 1.5 L of the nickel chloride solution obtained at the end of the electrolysis step in Example 2 to provide a solution having an acid concentration of 6N. The nickel chloride solution was passed through a column packed with 0.5 L of a strongly basic anion exchange resin available from Mitsubishi Chemical Corporation at a space velocity of SV 5 to 10. The anion exchange treatment was then carried out to obtain a purified nickel chloride solution.

The nickel chloride solution was then placed in a quartz container and heated to 80° C. on a hot plate to evaporate moisture. Once moisture was removed, the temperature was further raised to 220° C. in the atmosphere and held for 2 hours. 276 g of produced crystal was recovered.

This was crushed using a quartz mortar in a nitrogen atmosphere and sieved to obtain nickel chloride powder.

Analysis of the crystal structure of the nickel chloride powder by X-ray diffraction revealed that anhydrous nickel chloride was formed.

The impurity content in the anhydrous nickel chloride crystal was determined by GD-MS analysis, and results are shown in Table 1. Table 1 also shows results of measurement of particle size using a sieve, bulk density and tapped density.

Comparative Example 2

The same crystal production step as in Example 2 was carried out with the exception that 1.5 L of the nickel chloride solution obtained at the end of the electrolysis step in Example 2 was used as it was without the purification step for removing iron, to obtain nickel chloride powder.

Analysis of the crystal structure of the nickel chloride powder by X-ray diffraction revealed that anhydrous nickel chloride was formed.

The impurity content in the anhydrous nickel chloride crystal was determined by GD-MS analysis, demonstrating that 7 wt. ppm of iron was contained. Results including other components are shown in Table 1. Table 1 also shows results of measurement of particle size using a sieve, bulk density and tapped density.

With respect to each anhydrous nickel chloride crystal of Examples 1 to 3 and Comparative Examples 1 and 2, the water content was measured by a differential heat-thermogravimetry simultaneous measurement (TG-DTA) apparatus in a dry room. The respective values obtained are as follows:

Example 1:0.4; Example 2: 0.3; Example 3: 0.3; Comparative Example 1: 15.3; Comparative Example 2: 0.3 (wt. %).

Electrolytic synthesis was carried out using the apparatus shown in FIG. 1. An electrolytic bath 1 is partitioned by an anion exchange membrane 4, and the inside of the anode side is filled with an anolyte 10a and the inside of the cathode side is filled with a catholyte 10b. Attached to the anolyte 10a is an anode 2 to which raw material nickel 5 is attached in a state of where it is immersed in the anolyte. Attached to the catholyte 10b is a cathode 3 to which a conductive material 6 is attached in a state where it is immersed in the catholyte 10b.

FIG. 2 shows another embodiment of the apparatus where a cathode side is the same as in FIG. 1, but raw material nickel 5 is placed in an anode basket 50 on the anode side. The surface of the anode basket 50 facing a cathode 3 is provided with an opening and the surface of the anode basket 50 is closed with a filter cloth 51 so that the raw material nickel 5 does not come out.

INDUSTRIAL APPLICABILITY

According to the present invention, it is possible to obtain anhydrous nickel chloride having higher purity, and in particular smaller content of iron components, than the prior

TABLE 1

| | Example 1 | Example 2 | Example 3 | Comparative Example 1 | Comparative Example 2 |
|---|---|---|---|---|---|
| Purity of Raw Material Nickel | 5N | 4N | 4N | 5N | 4N |
| Iron Removal Step | None | Solvent Extraction | Ion Exchange | None | None |
| Crystallization Temperature (Drying/Dehydrating Temperature) | 180° C. | 200° C. | 220° C. | 160° C. | 200° C. |
| Boron, Sodium, Magnesium, Aluminum, Potassium, Calcium, titanium, Chromium, Manganese, Copper, Zinc, Arsenic, Silver, Cadmium, Indium, Tin, Thallium, Lead (wt. ppm) | <1 | <1 | <1 | <1 | <1 |
| Iron (wt. ppm) | <1 | <1 | <1 | <1 | 7 |
| Silicon, cobalt (wt. ppm) | <5 | <5 | <5 | <5 | <5 |
| Presence or Absence of Hexahydrate | Absence | Absence | Absence | Presence | Absence |
| Particle Size of 4 mm or more (wt. %) | 63 | 58 | 74 | 55 | 72 |
| Particle Size of 0.3 mm or less (wt. %) | 6 | 9 | 6 | 10 | 8 |
| Bulk Density (g/cm$^3$) | 2.0 | 1.8 | 2.9 | 2.1 | 1.4 |
| Tapped Density (g/cm$^3$) | 2.5 | 2.3 | 3.2 | 2.6 | 1.9 | art, by the steps with lower environmental load than the prior art. The present invention is an industrially useful invention.

DESCRIPTION OF REFERENCE NUMERALS

1 . . . electrolytic bath
2 . . . anode
3 . . . cathode
4 . . . ion exchange membrane
5 . . . raw material nickel
6 . . . conductive material
10a . . . anolyte
10b . . . catholyte
50 . . . anode basket
51 . . . filter cloth

What is claimed is:

1. Anhydrous nickel chloride having a total content of impurity elements other than gas components of less than 10 wt. ppm; each content of boron, sodium, magnesium, aluminum, potassium, calcium, titanium, chromium, manganese, iron, copper, zinc, arsenic, silver, cadmium, indium, tin, thallium and lead of less than 1 wt. ppm; and each content of silicon and cobalt of less than 5 wt. ppm.

2. Anhydrous nickel chloride having an oxygen content of less than 350 wt. ppm (or a water content of less than 0.5 wt. %).

3. The anhydrous nickel chloride according to claim 1, wherein the total of particles having a particle size of 4 mm or more is 10 wt. % or more, and particles having a particle size of 0.3 mm or less are 30 wt. % or less.

4. The anhydrous nickel chloride according to claim 1, wherein the anhydride nickel chloride has a bulk density of 1.5 to 3.0 g/cm$^3$ and a tapped density of 2.0 to 3.3 g/cm$^3$.

5. A method for producing nickel chloride anhydride according to claim 1, comprising the steps of:
    carrying out ion exchange membrane electrolysis in an anolyte and a catholyte separated by an anion exchange membrane using raw metal nickel as an anode, a conductive material as a cathode and high purity hydrochloric acid as an electrolytic solution, to obtain a nickel chloride solution as the anolyte;
    concentrating the obtained nickel chloride solution by heating it at 80 to 100° C. under atmospheric pressure to obtain a concentrated nickel chloride solution; and
    dehydrating and drying the resulting concentrated nickel chloride solution by heating it at 180 to 220° C. under atmospheric pressure to obtain anhydrous nickel chloride.

6. The method according to claim 5, wherein after the step of obtaining the nickel chloride solution as the anolyte, the method comprises any one of the following steps (a) to (c):
    (a) contacting the nickel chloride solution with a solvent extracting agent and then separating them to obtain an iron-removed nickel chloride solution;
    (b) contacting the nickel chloride solution with an ion exchange resin and then separating them to obtain an iron-removed nickel chloride solution; and
    (c) adding hydrogen peroxide water to the nickel chloride solution or blowing oxygen-containing gas to provide an oxidation-reduction potential of 700 mV or more so that an iron ion is oxidized to trivalent one, and depositing and precipitating the iron ion and then separating it to obtain an iron-removed nickel chloride solution,
    and wherein after any one of the steps (a) to (c), the method further comprises conducting the following step, using the iron-removed nickel chloride solution as a nickel chloride solution:
    concentrating the resulting nickel chloride solution by heating it at 80 to 100° C. under atmospheric pressure to obtain a concentrated nickel chloride solution.

7. The method according to claim 5, wherein in the step of obtaining the concentrated nickel chloride solution, the obtained nickel chloride solution is heated and concentrated in a quartz container.

8. The method according to claim 5, wherein in the step of obtaining the concentrated nickel chloride solution, the heating is performed in the atmosphere.

9. The method according to claim 5, wherein in the step of obtaining anhydrous nickel chloride, the resulting concentrated nickel chloride solution is dried and dehydrated on a quartz container.

10. The method according to claim 5, wherein in the step of obtaining anhydrous nickel chloride, the drying is performed in an inert gas atmosphere.

11. The method according to claim 5, wherein the step of obtaining anhydrous nickel chloride is to dry and dehydrate the resulting concentrated nickel chloride solution by heating it at 180 to 220° C. under atmospheric pressure and crush the resulting product to obtain anhydrous nickel chloride powder.

12. The anhydrous nickel chloride according to claim 2, wherein the total of particles having a particle size of 4 mm or more is 10 wt. % or more, and particles having a particle size of 0.3 mm or less are 30 wt. % or less.

13. The anhydrous nickel chloride according to claim 2, wherein the anhydride nickel chloride has a bulk density of 1.5 to 3.0 g/cm$^3$ and a tapped density of 2.0 to 3.3 g/cm$^3$.

* * * * *